United States Patent [19]
Crary

[11] Patent Number: 5,802,579
[45] Date of Patent: Sep. 1, 1998

[54] SYSTEM AND METHOD FOR SIMULTANEOUSLY READING AND WRITING DATA IN A RANDOM ACCESS MEMORY

[75] Inventor: Philip D. Crary, Mission Viejo, Calif.

[73] Assignee: Hughes Electronics Corporation, Los Angeles, Calif.

[21] Appl. No.: 648,792

[22] Filed: May 16, 1996

[51] Int. Cl.$^6$ ............................... G06F 9/28; G06F 9/38
[52] U.S. Cl. .................. 711/149; 711/143; 711/150; 711/151; 711/155; 711/168; 365/189.04; 365/189.07; 365/230.05
[58] Field of Search .................. 395/410, 431; 365/189.04, 189.07, 233, 230.05, 436; 711/3, 143, 147, 149, 150, 151, 158, 168, 109, 155

[56] References Cited

U.S. PATENT DOCUMENTS

| | | | |
|---|---|---|---|
| 4,933,909 | 6/1990 | Cushing et al. | 365/230.05 |
| 5,001,671 | 3/1991 | Koo et al. | 365/230.05 |
| 5,321,652 | 6/1994 | Ito | 365/189.07 |
| 5,371,877 | 12/1994 | Draho et al. | 711/109 |
| 5,375,089 | 12/1994 | Lo | 365/189.04 |
| 5,422,858 | 6/1995 | Mizukami et al. | 365/233 |
| 5,479,128 | 12/1995 | Jan et al. | 327/270 |
| 5,568,443 | 10/1996 | Dixon et al. | 365/230.05 |
| 5,666,494 | 9/1997 | Mote, Jr. | 711/167 |

*Primary Examiner*—Eddie P. Chan
*Assistant Examiner*—Than V. Nguyen
*Attorney, Agent, or Firm*—Georgann S. Grunebach; Terje Gudmestad; Michael W. Sales

[57] ABSTRACT

A system (10) and method for providing simultaneous data reading and writing for a random access memory (18) include storing new data (14) and a corresponding new data address (26), comparing the new data address to a current read address (32), and substituting (38) the new data for the data at the current read address at the output (38) while simultaneously writing the new data into the memory (18). The system and method are particularly suited for application in space-based communication satellites which utilize continuous memory read accesses since the invention provides the functionality of a dual-ported RAM while being implementable with fewer gates and less complex control circuitry to provide reduced power consumption.

14 Claims, 2 Drawing Sheets

SYSTEM AND METHOD FOR SIMULTANEOUSLY READING AND WRITING DATA IN A RANDOM ACCESS MEMORY

TECHNICAL FIELD

The present invention relates to a system and method for modifying data stored in a random access memory (RAM) without interrupting the reading of the RAM.

BACKGROUND ART

Many satellite applications, particularly communications satellites, have extremely tight requirements on the weight of various satellite components. Reducing component weight has many attendant advantages throughout the life of the satellite. Weight reduction may have an associated cost reduction beginning with the construction of the satellite by reducing material cost (although some ultra-light weight materials are more costly than their conventional counterparts). The requirements for structural integrity and the amount of fuel required to launch a satellite are also related to the weight of the satellite. Similarly, once in orbit, control and maintenance of an appropriate orbit including proper stationkeeping may also be affected by the weight of the satellite.

Electrical energy used to control the satellite and power communication equipment is often provided initially by one or more batteries and then supplemented by solar energy collected by large solar panels deployed once in orbit. Satellite power consumption must be carefully monitored and controlled to provide consistent, high quality communication over the intended satellite coverage area, i.e. its footprint, throughout the useful life of the satellite. Power requirements also indirectly affect the weight of the satellite due to the necessary energy storage capacity of the batteries so that sufficient energy may be provided during periods when solar energy is reduced or unavailable.

Thus, component weight and power consumption are two important parameters of the many considerations during design and implementation of any satellite application. It is desirable to reduce or minimize both component weight and power consumption to improve the efficiency and reduce the cost of construction and/or operation of the satellite based on its intended mission.

One component used extensively in space based mobile to mobile communications satellites which affects both the weight and power consumption of those satellites is the random access memory (RAM). These memories are used both in controlling the satellites and in providing digital communication which may include data routing, error detection and correction, data validation, encryption, and the like. The memories provide for accessing (reading or writing) data based on a particular location or address within the memory. The RAMs are often implemented in custom designed application specific integrated circuits (ASICs) which have significant development and manufacturing costs but are required to achieve the performance necessary for these applications.

Data is stored in RAM by "writing" the data to a particular location within the RAM which has an associated address. This process includes providing the address on one or more address lines, providing the data on one or more data lines (one or more of which may be coincident with the address lines), and asserting a write enable line. The stored data may then be retrieved from the RAM by "reading" the data from a particular address. The read cycle proceeds in a similar fashion as the write cycle where an address is provided, the read enable is asserted, and the memory provides the data stored in the location indicated by the address on the one or more data lines. A memory "access" may involve a read, a write, or both.

A variety of RAM implementations have been developed to accommodate the memory access requirements of various applications. Single-ported RAMs typically allow either a read or a write, but not both, during any particular memory access. This limitation reduces the number of gates and the complexity of control circuitry required for implementation with an associated reduction in power consumption. Dual-ported RAMs allow reading and writing of data during the same memory access, i.e. at substantially the same time. This increased functionality requires more complex control circuitry and more gates to implement than a similarly sized single-ported RAM. One alternative to a dual ported RAM is a ping-pong RAM.

Ping-pong style RAMs require almost twice as much RAM space as a single-ported or dual-ported RAM. This arrangement utilizes first and second RAMs having corresponding addresses. Data in the first RAM is updated (written) while data in the second RAM is being read. When the writes are completed, the function of the RAMs is switched such that the first RAM is read while the second RAM is updated. For some applications, the same RAM locations must be updated in each RAM such that each modification of data actually requires two memory accesses. In the case of a satellite where those modifications are transmitted over a slow link, this may result in a significant throughput loss. Furthermore, additional complexity of the on-board processor may be required to issue the same modifications to each RAM. The ping-pong arrangement also results in additional power consumption and added weight over that of a single-ported RAM.

DISCLOSURE OF THE INVENTION

It is thus an object of the present invention to provide a system and method for accessing a random access memory which allows for reading and writing of data during a single memory access.

It is a further object of the present invention to provide a system and method for modifying data stored in a random access memory without interrupting retrieval of previously stored data.

Another object of the present invention is to provide a system and method which utilizes a single-ported random access memory to provide the functionality of a dual-ported random access memory with reduced power consumption.

Yet another object of the present invention is to provide a system and method for controlling data routing and configuration in a communications satellite using a random access memory.

A still further object of the present invention is to provide a system and method for controlling access to a random access memory which allows updating the memory without interrupting continuous sequential reading of the memory.

In carrying out the above objects and other objects, features, and advantages of the present invention, a method for simultaneously reading and writing data to a random access memory includes storing a modification address corresponding to one of a plurality of locations in the random access memory, storing modification data corresponding to the modification address at a location other than the plurality of locations, receiving a request to retrieve stored data from the memory at the modification address, retrieving the modification data, and substantially simultaneously storing the modification data in the memory at the modification address.

A system for simultaneously reading and writing data to a random access memory according to the present invention includes an address register for storing a modification address, a data register for storing modification data corresponding to the modification address, and a current read address generator. The system also includes address comparison logic to compare the modification address to an address generated by the current read address generator and a multiplexer to select data for output from either the data register or the memory based on the comparison. The address comparison logic is operative to generate a write enable signal such that the modification data is written to the memory while simultaneously output through the multiplexer.

The advantages accruing to the present invention are numerous. For example, the present invention provides the functionality of a dual-ported RAM utilizing a single-ported RAM with relatively simple logic construct and control circuitry which reduces the number of gates required for implementation and consequently power consumption. In addition, the present invention provides a circuit which simplifies testing after installation when compared to prior art approaches. When this approach is applied throughout a system, such as in a communications satellite, a corresponding reduction in weight may also be realized since only about half as many RAMS would be required to control data routing and configuration compared to conventional design and implementation. The logic construct of the present invention provides for writing to a RAM while avoiding the implementational complexity and overhead of the prior art systems and methods.

The above objects and other objects, features, and advantages of the present invention will be readily appreciated by one of ordinary skill in this art from the following detailed description of the best mode for carrying out the invention when taken in connection with the accompanying drawings.

BEST MODE FOR CARRYING OUT THE INVENTION

Figure 1:
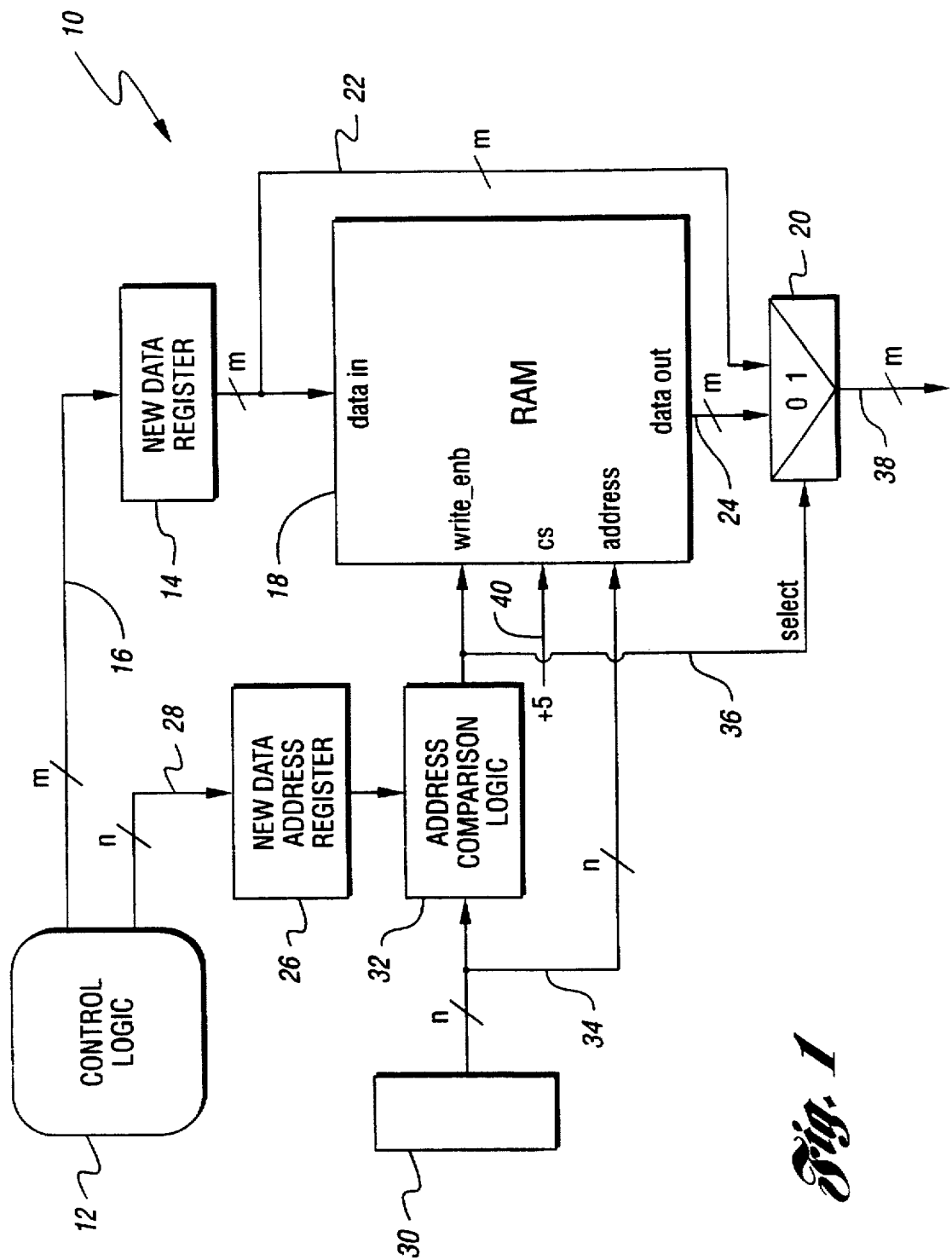
FIG. 1 is a block diagram of a system for providing simultaneous read and write functions utilizing a single-ported RAM according to the present invention.

Referring now to FIG. 1, one embodiment of a system for providing non-interrupting RAM access according to the present invention is shown, as indicated generally by reference numeral 10. In one embodiment, system 10 is implemented in an application specific integrated circuit (ASIC). Control logic 12 communicates with new data register 14 via one or more (m) data lines 16. In one embodiment, eight data lines 16 (i.e. m=8) are used to communicate new or modifying data from control logic 12 to new data register 14. Of course any number of data lines may be used according to the present invention depending upon the particular application. New data register 14 communicates with random access memory (RAM) 18 and multiplexer 20 via modifying data lines 22. RAM 18 is preferably a single-ported RAM implemented with low-power logic, such as CMOS or the like. Multiplexer 20 also communicates with RAM 18 via data output lines 24.

As also illustrated in FIG. 1, control logic 12 communicates with a new data address register 26 via new data address lines 28. The number of address lines (n) will vary according to the size or number of locations of RAM 18 and whether any address and data lines are coincident. An address generator 30 communicates with address comparison logic 32 and RAM 18 via address lines 34. Address comparison logic 32 communicates with RAM 18 and multiplexer 20 via select/enable line 36. Chip select line 40 provides a logic "high level" signal to RAM 18 which is used to enable memory accesses.

In operation, address generator 30 continuously generates an address on address lines 34 to read data from RAM 18. This data is provided to multiplexer 20 via data output lines 24. When no modifying data is present in new data register 14, or when modifying data is present but the address produced by address generator 30 does not match the address in new data address register 26, select/enable line 36 provides a signal to multiplexer 20 such that data read from RAM 18 is passed to system output lines 38.

To modify a memory location in RAM 18 without interrupting the continuous reading of memory locations in RAM 18, control logic 12 is operative to temporarily store the new data in new data register 14 while storing its associated address in new data address register 26. Writing (storing) data in new data address register 26 sets a flag which remains set until the data is written to RAM 18. New data register 14 provides the new data to RAM 18 and also to multiplexer 20 via modifying data lines 22. The new data address is provided to address comparison logic 32 where it is compared to each of the addresses provided by address generator 30. When the new data address matches the current address provided by address generator 30, address comparison logic asserts select/enable line 36 which is connected to the write enable input of RAM 18 and the select input of multiplexer 20. As such, the data present in new data register 14 is written into RAM 18 at the location indicated by the current address provided by address generator 30 (which is the new data address). Assertion of select/enable line 36 also provides a signal to multiplexer 20 such that the data in new data register 14 is passed to system output lines 38. Thus, the new data is provided to the system output lines 38 substantially simultaneously as it is written into RAM 18. This allows an uninterrupted data stream at system output lines 38 while also allowing modification of data in memory. The only limitation to the implementation illustrated is that it requires a delay between accesses to RAM 18 for the number of clock cycles equal to the size or depth of RAM 18. However, when the transmission rate for the data modification command or the control logic sending the data modifications is slow enough, i.e. less than the time period required for the delay, this limitation does not impact system performance.

In one embodiment of the present invention, system 10 may be used in a space-based, mobile to mobile communications satellite to control data routing and configuration. RAM 18 may be a 64×8, for example, which is used to constantly route data. In such an application, the addresses provided by address generator 30 would have sequentially cycling values corresponding to locations zero through sixty-three. The value of data on system output lines 38 would then represent another address which would be used to access a second RAM (not specifically illustrated). Data stored in RAM 18 may then be used to read call data from various programmable locations in the second RAM. Occasionally, this routing information, i.e. the data in RAM 18, needs to be updated or modified. In this example, one write to RAM 18 may be completed every sixty-four clock cycles. This limitation does not impact the performance of the system because requests to modify data stored in RAM 18 occur at a rate which is significantly slower than the required delay period.

Figure 2:
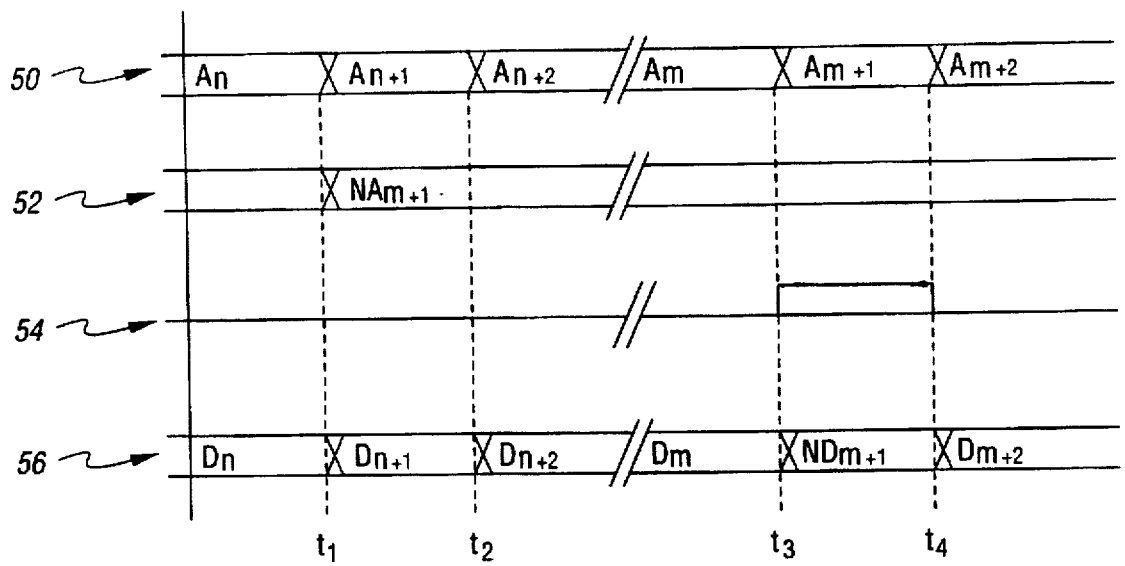
FIG. 2 is a timing diagram illustrating operation of the system of FIG. 1.

Referring now to FIG. 2, a timing diagram illustrating operation of the system of FIG. 1 according to the present invention is shown. The timing of a signal representing a current address provided by address generator 30 on address lines 34 is indicated generally by reference numeral 50. The values of that signal at various times $t_1$ through $t_4$ are indicated generally by $A_n$ through $A_{m+2}$. Similarly, the timing of a signal representing a new data address provided on new data address lines 28 is indicated generally by reference numeral 52. The timing of a signal on select/enable line 36 is indicated generally by reference numeral 54 and the timing of a signal representing data on system output lines 38 is indicated generally by reference numeral 56. The values of the data at times $t_1$ through $t_4$ are represented by $D_n$ through $D_{m+2}$, respectively, where $ND_{m+1}$ represents the value of the new data corresponding to address $NA_{m+1}$ which is written into location $A_{m+1}$ during the access cycle between times $t_3$ and $t_4$.

As illustrated in FIG. 2, during memory access beginning at time $t_1$, data $D_{n+1}$ is read from memory location $A_{n+1}$ and provided on system output lines 38 through multiplexer 20 since select/enable line 36 is not asserted as indicated by select/enable timing 54. A new data address ($NA_{m+1}$) is placed in new data address register 26 as shown by new address timing 52. Modifying data is also placed in new data register 14 although not specifically illustrated. Data continues to be read from RAM 18 until time $t_3$ where the current address ($A_{m+1}$) is equal to the new data address ($NA_{m+1}$) at which time the select/enable line 36 is asserted as shown by timing 54. Assertion of the select/enable causes new data ($ND_{m+1}$) to be provided on system output lines as indicated by timing 56 while also writing the new data into RAM 18 at the current location ($A_{m+1}=NA_{m+1}$). Thus, a memory read is simulated by providing the new data while actually performing a memory write substantially simultaneously to update the current location. As indicated by system output timing 56, data is continuously provided on system output lines.

Figure 3:
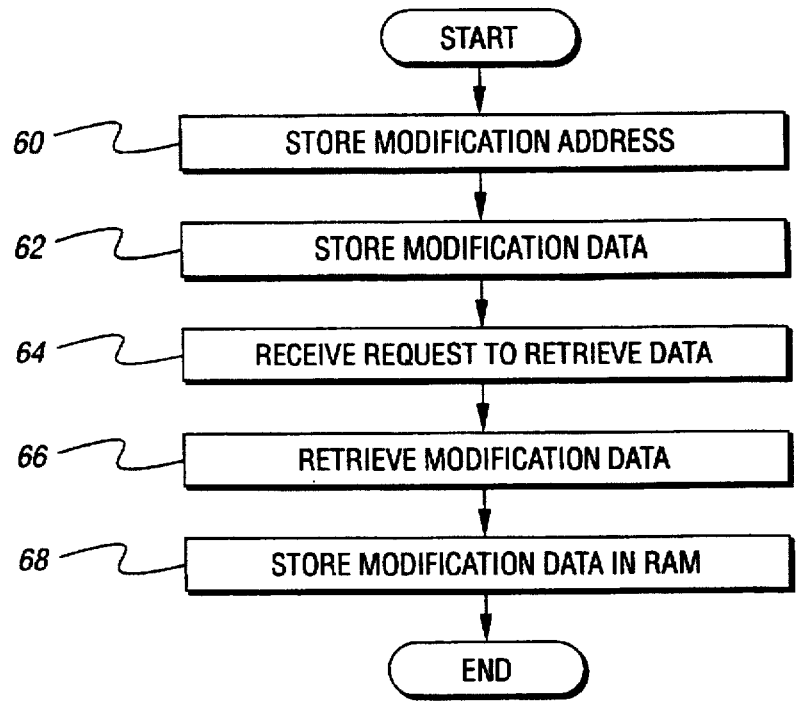
FIG. 3 is a flow chart illustrating a system and method for providing non-interrupting RAM access according to the present invention.

Referring now to FIG. 3, a flowchart illustrating a system and method for simultaneously reading and writing data to a random access memory is shown. One of ordinary skill in the art will recognize that the sequence of steps illustrated in the flowchart is not necessarily important to the operation of the present invention but is shown for ease of illustration and description. In certain instances, blocks representing operations or steps may be interchanged or performed simultaneously. For example, blocks 60 and 62 may be interchanged or performed simultaneously while still achieving the objects of the present invention. Likewise, the operations or steps represented by the blocks of FIG. 3 may be performed by hardware, software, or a combination thereof without departing from the spirit or scope of the present invention.

A modification address corresponding to one of the locations within the RAM is stored as represented by block 60. Preferably, the modification address is stored in a register external to the RAM, such as new data address register 26 (FIG. 1), which is in communication with control logic which controls the memory access. Although external to the RAM, the modification address register is preferably implemented on or in combination with an ASIC along with the RAM. The modification address is also preferably communicated to comparison logic which determines when the current address corresponds to the modification address.

Modification or "new" data is stored in a new data register as represented by block 62. Similar to the modification address register, the modification data register is preferably separate from the RAM but may be implemented in the same ASIC. A request to read data from the RAM is received as represented by block 64. When the address corresponding to the request to retrieve data is the same as, or corresponds to, the modification address, the modification data is retrieved from the modification data register as represented by block 66. Substantially simultaneously, i.e. during the same memory access, the modification data is stored in the RAM as represented by block 68.

It is understood, of course, that while the forms of the invention herein shown and described include the best mode contemplated for carrying out the present invention, they are not intended to illustrate all possible forms thereof. It will also be understood that the words used are descriptive rather than limiting, and that various changes may be made without departing from the spirit or scope of the invention as claimed below.

What is claimed is:

1. A method for providing simultaneous modification and retrieval of data using a single-ported memory having a plurality of locations each having a corresponding address, the method comprising:

storing a modification address corresponding to one of the plurality of locations;

storing modification data corresponding to the modification address at a location other than the plurality of locations;

receiving a request to retrieve stored data from the memory at the modification address;

retrieving the modification data from the location other than the plurality of locations; and substantially simultaneously storing the modification data in the memory at the modification address.

2. The method of claim 1 wherein storing a modification address comprises storing a modification address in a register external to the memory.

3. The method of claim 1 wherein receiving comprises receiving a request to retrieve data stored at a location corresponding to the modification address.

4. A method for providing modification and retrieval of data stored in a single-ported random access memory at a plurality of locations each having a corresponding address, the method comprising:

storing a first address corresponding to one of the plurality of locations of the single-ported random access memory in a first register;

storing modification data associated with the first address in a second register;

receiving a request to retrieve stored data from the random access memory at a second address corresponding to one of the plurality of locations;

comparing the second address to the first address;

retrieving the stored data from the random access memory when the comparing step indicates that the first address does not correspond to the second address; and retrieving the modification data from the second register and storing the modification data from the second register and substantially simultaneously storing the modification data in the random access memory when the comparing step indicates that the first address corresponds to the second address.

5. The method of claim 4 wherein comparing comprises determining when the first and second addresses correspond to the same one of the plurality of locations.

6. The method of claim 5 wherein comparing comprises determining when the first and second addresses are identical.

7. The method of claim 4 wherein the steps of retrieving the stored data and retrieving the modification data are performed mutually exclusively.

8. The method of claim 4 further comprising:
mutually exclusively selecting either the stored data or the modification data for output based on the step of comparing.

9. The method of claim 4 wherein retrieving the modification data from the first register and storing the modification data in the random access memory are performed during a single memory access cycle.

10. A system for providing substantially simultaneous modification and retrieval of data stored in a single-ported random access memory at a plurality of locations each having an associated address, the system comprising:
a random access memory;
a first register in communication with the random access memory for storage of modification data;
a second register for storage of a modification data address associated with the modification data;
logic in communication with the second register and the random access memory for determining when a retrieval request corresponds to the modification data address; and
a multiplexer in communication with the random access memory, the logic, and the first register for selecting one of the modification data and the data stored in the random access memory for output based on the determination of the logic, wherein the logic causes the multiplexer to select the first register for output when a read request corresponding to the modification data address is received while substantially simultaneously causing the modification data to be stored in the random access memory.

11. The system of claim 10 wherein the random access memory is a single-ported random access memory.

12. The system of claim 11 further comprising an address generator in communication with the logic and the random access memory for providing an address associated with the retrieval request.

13. The system of claim 10 wherein the random access memory, the first and second registers, and the logic are implemented in a single integrated circuit.

14. The system of claim 10 wherein the first and second registers are located external to the random access memory.

* * * * *